United States Patent
Li

(10) Patent No.: US 8,169,577 B2
(45) Date of Patent: May 1, 2012

(54) THIN-FILM TRANSISTOR PHOTOSENSOR, LIQUID CRYSTAL DISPLAY PANEL AND METHOD OF FORMING DIELECTRIC LAYER HAVING F-SIOC: H COMPOUND

(75) Inventor: Cho-Yu Li, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 376 days.

(21) Appl. No.: 12/581,158

(22) Filed: Oct. 18, 2009

(65) Prior Publication Data
US 2011/0013133 A1    Jan. 20, 2011

(30) Foreign Application Priority Data
Jul. 15, 2009  (TW) .............................. 98123873 A

(51) Int. Cl.
*G02F 1/1337* (2006.01)
*H01L 31/00* (2006.01)
*H01L 27/14* (2006.01)
*H01L 21/469* (2006.01)

(52) U.S. Cl. ............ 349/129; 349/130; 257/59; 257/72; 438/788

(58) Field of Classification Search .......... 349/129–130; 438/788
See application file for complete search history.

(56) References Cited

U.S. PATENT DOCUMENTS

| | | | |
|---|---|---|---|
| 6,372,291 B1 | 4/2002 | Hua et al. | |
| 6,593,248 B2 * | 7/2003 | Loboda et al. | 438/758 |
| 7,880,819 B2 * | 2/2011 | Abileah et al. | 349/12 |
| 7,888,741 B2 * | 2/2011 | Edelstein et al. | 257/365 |
| 2006/0051973 A1 * | 3/2006 | Cheng et al. | 438/763 |
| 2010/0015748 A1 * | 1/2010 | Yun | 438/70 |

FOREIGN PATENT DOCUMENTS

| | | |
|---|---|---|
| CN | 1644753 A | 7/2005 |
| CN | 101325181 A | 12/2008 |
| EP | 1225194 A2 | 7/2002 |
| TW | 518693 | 1/2003 |

* cited by examiner

*Primary Examiner* — James Dudek
(74) *Attorney, Agent, or Firm* — Winston Hsu; Scott Margo

(57) ABSTRACT

A thin-film transistor photosensor and a liquid crystal display (LCD) panel respectively utilize a dielectric layer having F—SiOC: H compound and a bump structure having F—SiOC: H compound so as to form a thin-film transistor photosensor having lower resistor-capacitor loading (RC loading) and an LCD panel having low-dielectric F—SiOC: H compound respectively. In addition, a method of forming a dielectric layer having F—SiOC: H compound utilizes gases including trimethyl silane, carbon tetrafluoride, argon, and oxygen for thin-film deposition process so as to form a low-k F—SiOC: H compound dielectric layer.

8 Claims, 5 Drawing Sheets

THIN-FILM TRANSISTOR PHOTOSENSOR, LIQUID CRYSTAL DISPLAY PANEL AND METHOD OF FORMING DIELECTRIC LAYER HAVING F-SIOC: H COMPOUND

BACKGROUND OF THE INVENTION

1. Field of the Invention

The present invention relates to a thin-film transistor photosensor, a liquid crystal display panel and a method of forming a dielectric layer having a F—SiOC:H compound, and more particularly, to a thin-film transistor photosensor with a low resistor-capacitor loading (RC loading), a liquid crystal display panel having a bump with a low dielectric coefficient, and a method of forming a dielectric layer having a F—SiOC:H compound.

2. Description of the Prior Art

In order to detect the surrounding light intensity, the thin-film transistor photosensor of liquid crystal displays disposed partially on a panel is commonly used. The light intensity of the backlight source will be automatically adjusted according to the detected light intensity. However, dielectric layer materials of the thin-film transistor photosensor such as silicon dioxide ($SiO_2$) or silicon nitride ($Si_3N_4$) have a low transparency and a high dielectric coefficient (i.e. high-k). It is to be noted that once the thin-film transistor photosensor is combined with high-k dielectric layers, its RC loading effect will be significantly increased, which further results in a serious time delay of electric signals. That is, it is important to reduce the time delay of electric signals, to lessen power loss, and to avoid signal interference between each other by applying dielectric layers with a low dielectric coefficient. In light of the abovementioned problems, it is desired in the industry to develop a dielectric layer that has properties of both a low dielectric coefficient and a high transparency, which can be applied successfully to thin-film transistor photosensor fabrication.

Additionally, a vertical arrangement technique has been mostly adopted in the wide-angle liquid crystal displays. However, the dielectric coefficient of bumps applied to the vertical arrangement is usually high; thus, they will interfere with the distribution of electrical power lines and cause a deflection effect while being disposed in the liquid crystal displays. Consequently, intersections of the adjacent liquid crystal molecules, which result in black-stripe images, will often happen in the wide-angle liquid crystal displays. Hence, developing a bump with a low dielectric coefficient that can be utilized in a multi-domain vertical arrangement technique for overcoming the disadvantage of black-stripe images is desired.

SUMMARY OF THE INVENTION

It is therefore one of the objectives of the present invention to provide a thin-film transistor photosensor with a low RC loading, a liquid crystal display panel having a bump with a low dielectric coefficient (i.e. a low-k bump), and a method of forming a dielectric layer having a F—SiOC:H compound.

In accordance with an embodiment of the present invention, it provides a thin-film transistor photosensor. The thin-film transistor photosensor includes a first substrate, a gate electrode, a gate dielectric layer, a semiconductor layer, a source electrode and a drain electrode, a F—SiOC:H compound dielectric layer, and a transparent protective layer. The gate electrode is disposed on the first substrate while the semiconductor layer corresponds to the gate electrode disposed on the gate dielectric layer. The source electrode and the drain electrode are disposed on the semiconductor layer as well as the gate dielectric layer, and they are respectively disposed on two sides of the gate electrode. The F—SiOC:H compound dielectric layer is formed on the semiconductor layer, the source electrode, and the drain electrode while the transparent protective layer is disposed on the F—SiOC:H compound dielectric layer.

Moreover, the present invention provides a liquid crystal display panel. The liquid crystal display panel includes a first substrate, a second substrate, a bump, and a liquid crystal layer, wherein the second substrate and the first substrate correspond to each other. Additionally, the bump is disposed on the first substrate and contains the F—SiOC:H compound. The liquid crystal layer is then formed between the first substrate and second substrate.

The present invention also provides a method of forming a dielectric layer having a F—SiOC:H compound. The method includes the following step: providing a substrate; and performing a high density chemical vapor phase deposition (CVD) to form a F—SiOC:H compound dielectric layer on the substrate, wherein gases utilized in performing the high density CVD include trimethyl silane ($HSi(CH_3)_3$), carbon tetrafluoride ($CF_4$), argon (Ar), and oxygen ($O_2$).

The present invention provides a thin-film transistor photosensor with a low RC loading as well as a liquid crystal display panel having a bump with a low dielectric coefficient (a low-k bump) upon offering a F—SiOC:H compound dielectric layer and a bump containing the F—SiOC:H compound respectively. The thin-film transistor photosensor with a low RC loading of the present invention is able to overcome the conventional problems of signal distortion and time delay of electric signals, originally contributed by an excessive RC loading in prior arts. Moreover, the liquid crystal display panel having a low-k bump can prevent black-stripe images in wide-angle display panels, resulted from a high dielectric coefficient of a bump, from happening. In addition, the method of forming a dielectric layer having the F—SiOC:H compound provided by the present invention utilizes gases including trimethyl silane, carbon tetrafluoride, argon, and oxygen to form a F—SiOC:H compound dielectric layer with a low dielectric coefficient by performing a thin-film deposition.

These and other objectives of the present invention will no doubt become obvious to those of ordinary skill in the art after reading the following detailed description of the preferred embodiment that is illustrated in the various figures and drawings.

DETAILED DESCRIPTION

Certain terms are applied throughout the following description and claims to refer to particular components. As one skilled in the art will appreciate, manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". In addition, the term "electrically connected" includes any directly or indirectly electrical connection methods. Therefore, if the description in the following paragraphs is that a first device is electrically connected to a second device, the aforementioned words stand for that the first device can be electrically connected to the second device directly or be electrically connected to the second device indirectly by means of other devices or electrical connection methods.

Figure 1:
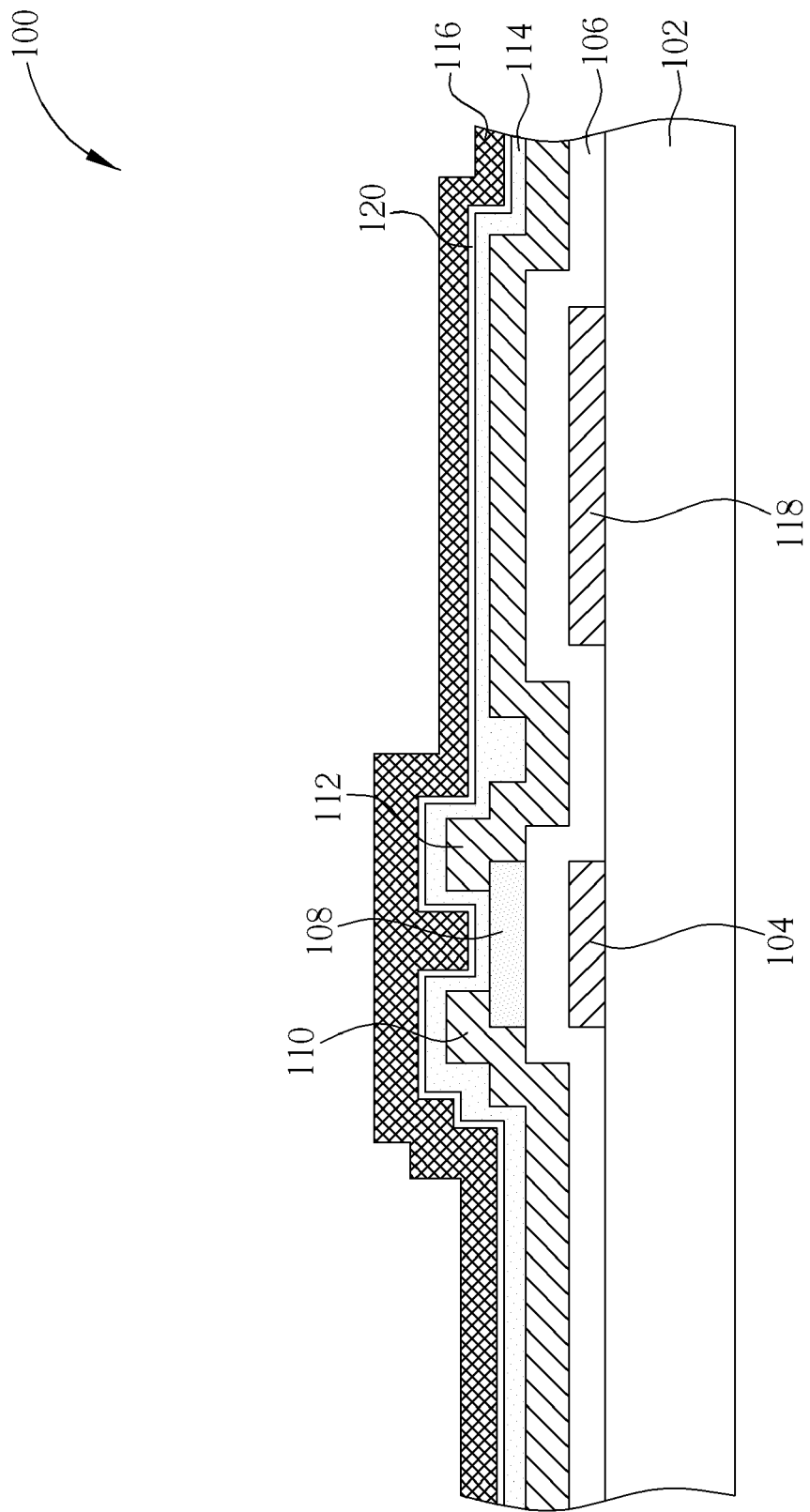
FIG. 1 is a schematic diagram of a thin-film transistor photosensor according to a preferred embodiment of the present invention.

FIG. 1 is a schematic diagram of a thin-film transistor photosensor according to a preferred embodiment of the present invention. As shown in FIG. 1, a thin-film transistor photosensor 100 of the present invention includes a first substrate 102, a gate electrode 104, a gate dielectric layer 106, a semiconductor layer 108, a source electrode 110, a drain electrode 112, a F—SiOC:H compound dielectric layer 114, and a transparent protective layer 116. Among them, the gate electrode 104 is disposed on the first substrate 102 while the gate dielectric layer 106 is disposed on the first substrate 102 and the gate electrode 104. The semiconductor layer 108 is corresponding to the gate electrode 104, which is disposed on the gate dielectric layer 106. The source electrode 110 and the drain electrode 112 are formed on the semiconductor layer 108 and the gate dielectric layer 106 and correspond to two sides of the gate electrode 104 respectively. The F—SiOC:H compound dielectric layer 114 is disposed on the semiconductor layer 108, the source electrode 110, and the drain electrode 112; the transparent protective layer 116 is disposed on the F—SiOC:H compound dielectric layer 114. The thin-film transistor photosensor 100 of the present invention may also contain a metal electrode 118 disposed on the first substrate 102, and an anti-reflective layer 120 disposed between the F—SiOC:H compound dielectric layer 114 and the transparent protective layer 116. In the present embodiment, a dielectric coefficient of the F—SiOC:H compound dielectric layer 114 is substantially between 2.0 and 2.4, an extinction coefficient of the F—SiOC:H compound dielectric layer 114 is substantially between, but not limited to, the range of 0.12 and 0.42, and its transparency is high. Moreover, the operational principle of the thin-film transistor photosensor 100 is to transform the environmental light energy irradiated on the semiconductor layer 108 into a form of photoelectric current in order to increase the overall current caught by the source electrode 110 and the drain electrode 112 while the thin-film transistor photosensor 100 is working. The current being detected can further be used to calculate and evaluate the relative luminous intensity of the environment. In addition, the anti-reflective layer 120 can be formed on the F—SiOC:H compound dielectric layer 114 for the thin-film transistor photosensor 100 to enhance its light sensitivity to the surrounding, wherein, the anti-reflective layer 120 contains a F—SiOC:H compound and has an almost zero extinction coefficient. It is to be noted that a preferred thickness of the anti-reflective layer 120 is less than that of the F—SiOC:H compound dielectric layer 114, but it should not be a limitation. An oxygen content of the anti-reflective layer 120 is substantially higher than that of the F—SiOC:H compound dielectric layer 114. To sum up, the F—SiOC:H compound dielectric layer 114 and the anti-reflective layer 120 adopted in the present invention are more advantageous over the conventional dielectric layer materials with a higher dielectric coefficient, such as silicon nitride or silicon dioxide. As a result, an internal capacitance effect of the thin-film transistor photosensor can be reduced. In brief, the thin-film transistor photosensor 100 of the present invention is able to significantly reduce the overall RC loading so that the signal electric transmission of the thin-film transistor photosensor 100 will be improved and the time delay issue can be solved.

Figure 2:
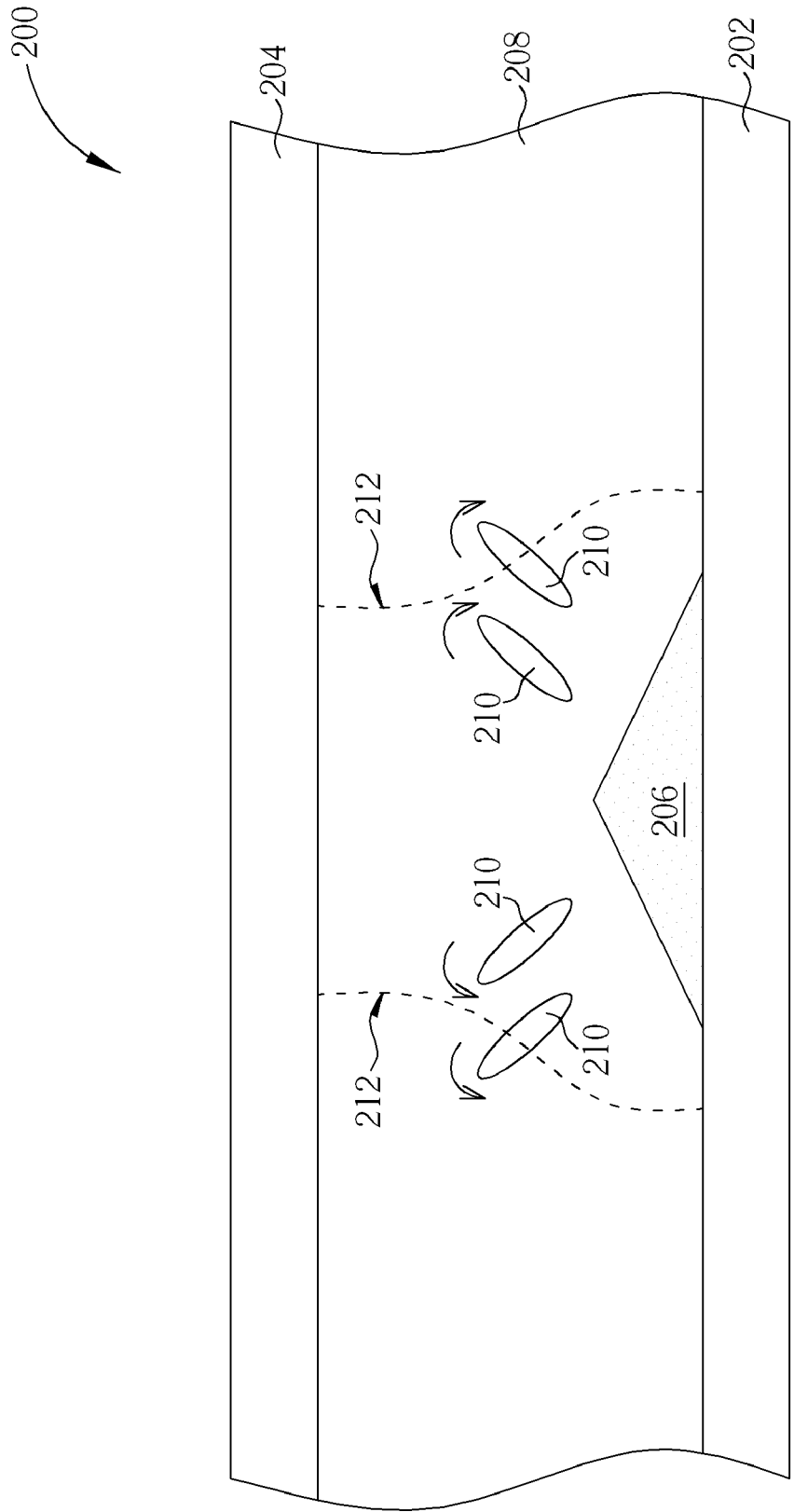
FIG. 2 is a schematic diagram of a liquid crystal display panel according to a preferred embodiment of the present invention.
Figure 3:
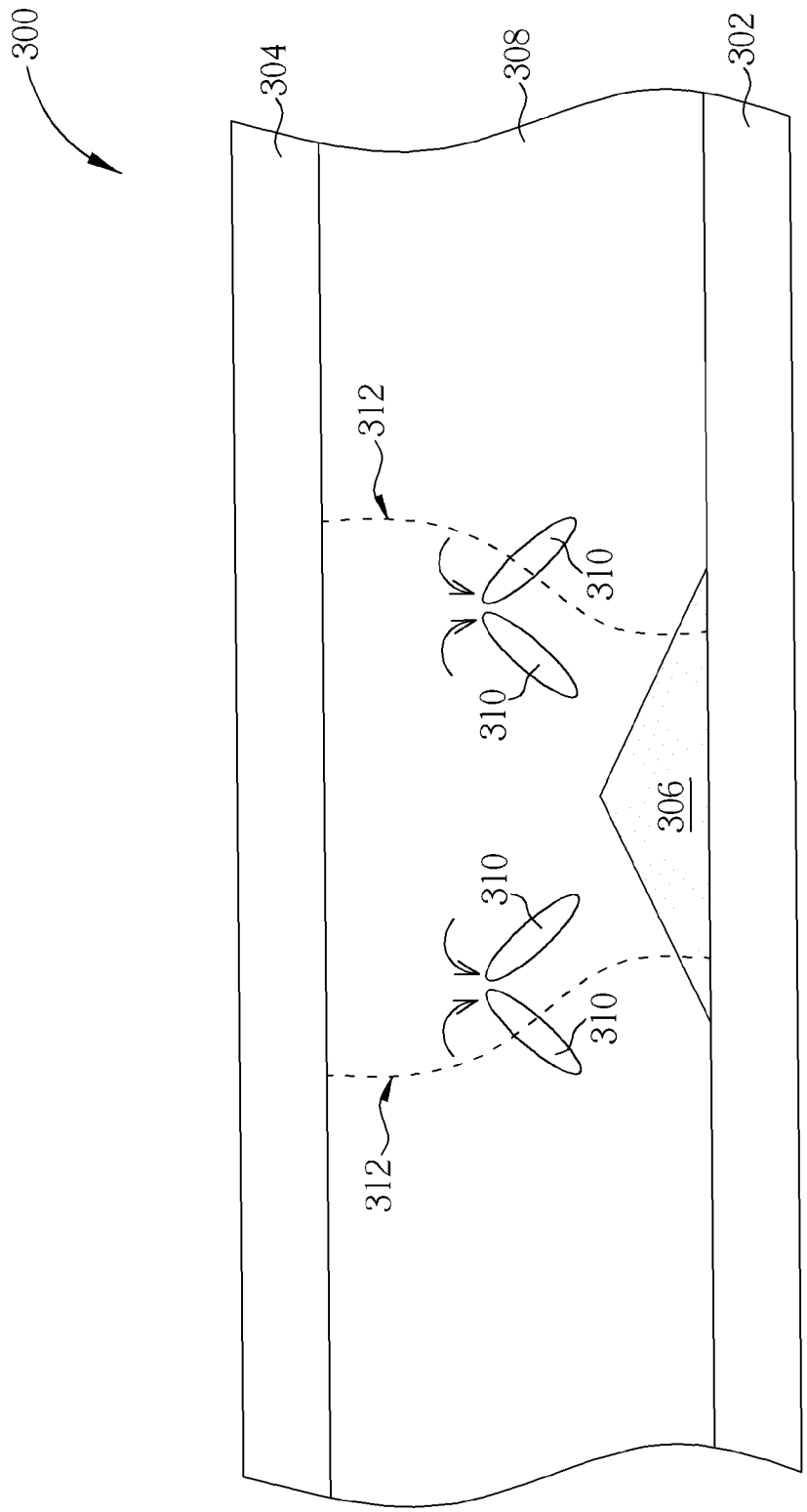
FIG. 3 is a schematic diagram of a wide-angle liquid crystal display panel.

FIG. 2 is a schematic diagram of a liquid crystal display panel according to a preferred embodiment of the present invention. A liquid crystal display panel 200 of the present invention includes a first substrate 202, a second substrate 204, a bump 206, and a liquid crystal layer 208, wherein the second substrate 204 and the first substrate 202 correspond to each other, and the bump 206 is disposed on the first substrate 202. The liquid crystal layer 208 is formed between the first substrate 202 and the second substrate 204. In the present embodiment, the bump 206 contains a F—SiOC:H compound, whose dielectric constant is substantially between 2.0 and 2.4. Furthermore, the liquid crystal layer 208 includes a plurality of liquid crystal molecules 210, which will be driven and deflected upon the field direction between the first substrate 202 and the second substrate 204. As shown in FIG. 2, electrical power lines 212 generated by the field between the first substrate 202 and the second substrate 204 will drive and deflect the adjacent liquid crystal molecules 210. In the present embodiment, the arrangement of the electrical power lines 212 will not be deflected since the dielectric constant of the F—SiOC:H compound is substantially between 2.0 and 2.4. In this case, the liquid crystal molecules 210 arranged on two sides of the bump 206 will be driven normally due to the neighboring electrical power lines 212, and the liquid crystal molecules 210 will deflect leftward or rightward respectively according to its position relative to the bump 206. Moreover, for illustrating the distinguishing advantage of the liquid crystal display panel of the present invention, FIG. 3 has shown a wide-angle liquid crystal display panel. In FIG. 3, a wide-angle liquid crystal display panel 300 also includes a first substrate 302, a second substrate 304, a bump 306, and a liquid crystal layer 308, and the liquid crystal layer 308 contains a plurality of liquid crystal molecules 310. The wide-angle liquid crystal display panel 300 further contains electric power lines 312. However, the arrangement of the electrical power lines 312 tends to deflect seriously due to a high dielectric constant of the bump 306 of the wide-angle liquid crystal display panel 300. Therefore, the liquid crystal molecules 310 arranged on two sides of the bump 306 will be driven and deflected toward the same direction by the adjacent electrical power lines 312, which resulted in intersections of the adjacent liquid crystal molecules 310 and further, black-stripe images. In a word, the liquid crystal display panel 200 of the present invention will not produce black-stripe images due to its bump 206 containing the F—SiOC:H compound.

Figure 4:
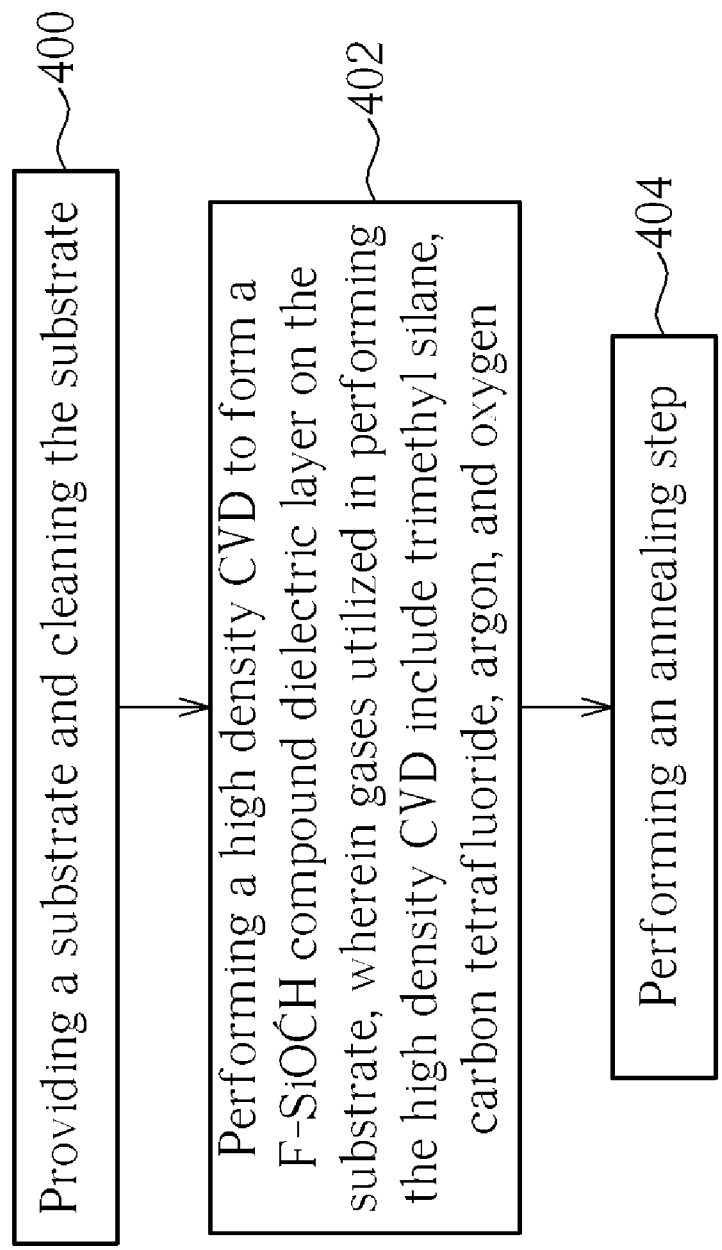
FIG. 4 is a flow chart of a method of forming a dielectric layer having a F—SiOC:H compound according to the present invention.
Figure 5:
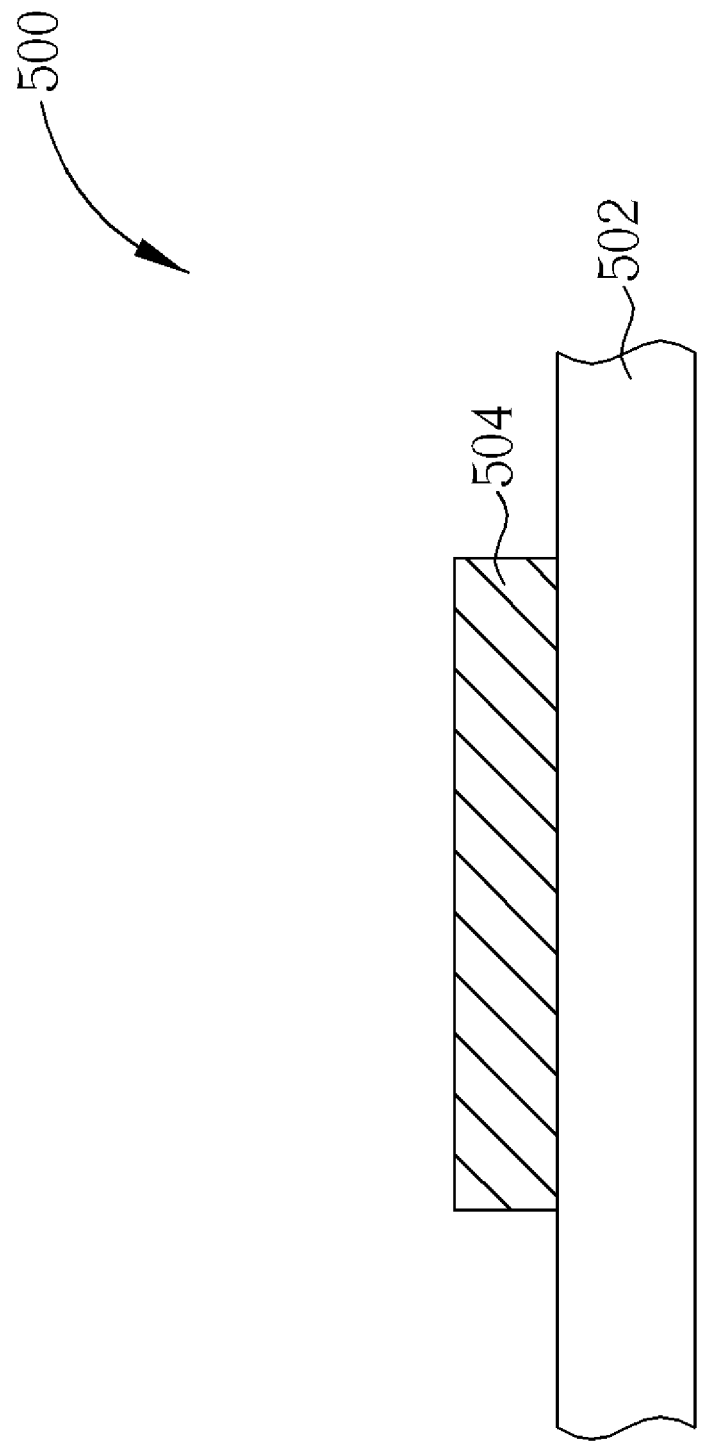
FIG. 5 is a structure diagram of forming a F—SiOC:H compound dielectric layer according to the present invention.

Referring to FIG. 4, a method of forming a dielectric layer having a F—SiOC:H compound of the present invention are shown as a flow chart. FIG. 5 is a structure diagram of forming a F—SiOC:H compound dielectric layer according to the present invention. FIG. 4 is in comparison with FIG. 5 for illustrating the flow of forming a dielectric layer having a F—SiOC:H compound and a structure 500 of the F—SiOC:H compound dielectric layer. The method of forming a dielectric layer having a F—SiOC:H compound includes the three following steps:

Step 400: providing a substrate and cleaning the substrate;

Step 402: performing a high density chemical vapor phase deposition to form a F—SiOC:H compound dielectric layer on the substrate, wherein gases utilized in performing the high density CVD include trimethyl silane, carbon tetrafluoride, argon, and oxygen; and Step 404: performing an annealing step.

The aforesaid flow chart shows the method of forming a dielectric layer having a F—SiOC:H compound. A substrate 502 indicated in step 400 may be a glass substrate, a wafer, a metal electrode, and so on. The substrate will be cleaned before performing the process of high density CVD in step 402, wherein the cleaning step includes chemical cleaning courses to remove contaminations, such as micro-particles, native oxide layer, organic substances, and inorganic substances so that the substrate 502 can have a better adhesiveness.

Moreover, a dielectric constant of a F—SiOC:H compound dielectric layer 504 in step 402 is substantially between, but not limited to, the range of 2.0 and 2.4. A preferred thickness of the F—SiOC:H compound dielectric layer 504 is substantially between, but not limited to, the range of 200 Å and 14000 Å. A fluorine content of the F—SiOC:H compound dielectric layer 504 is substantially between, but not limited to, the range of 0.5% and 5.0%. As for gases utilized in performing the high density CVD in step 402, preferred parameters are described as follows: quantity of flow of the trimethyl silane is substantially between 5 and 100 sccm (standard cubic centimeter per minute); quantity of flow of the carbon tetrafluoride is substantially between 5 and 100 sccm; quantity of flow of the argon is substantially between 5 and 100 sccm; and quantity of flow of the oxygen is substantially between 5 and 100 sccm. The above-mentioned parameters contribute preferred embodiments of forming the F—SiOC:H compound dielectric layer 504 to the present invention, but not limitations. Other parameter combinations of quantity of flows are possible. It is to be noted that the composition of the preferred F—SiOC:H compound dielectric layer 504 can be denoted as $SiO_XF_YC_ZH_W$, wherein X: 1-2, Y: 1-4, Z: 1-2, W: 1-2, but are not limited to the ranges. In the present embodiment, the argon can not only help ignite plasma but also can control the thin-film transistor to grow more evenly. Concerning the temperature parameter during the high density CVD process, it is substantially between, but not limited to, the range of 300° C. and 350° C. The power for performing the high density CVD is substantially between 300 watt and 350 watt, and preferably uses, but not limited to, an Inductively Coupled Plasma (ICP) as a power supply. The pressure for performing the high density CVD in the present invention is substantially, but not limited to, 1 Torr.

The annealing step in step 404 is to repair lattice damage of the F—SiOC:H compound dielectric layer 504 so that it can regain a single crystal structure and can activate dopant atoms to provide electrons-holes effectively as major current transmission carriers. The annealing step in step 404 utilizes, but not limited to, 10 liter nitrogen substantially. According to the conventional principles and the rule of thumb in real practice, the required temperature for the annealing step has to be higher than that for the high density CVD process to achieve a better annealing effect. Preferably, the temperature of the annealing step is between, but not limited to, the range of 400° C. and 450° C., and its heating process may last for, but not limited to, 30 minutes. In brief, the method of forming a dielectric layer having a F—SiOC:H compound of the present invention have a technical feature that only three steps 400, 402, and 404 are required to for the F—SiOC:H compound dielectric layer 504.

In conclusion, The present invention provides a thin-film transistor photosensor with a low RC loading as well as a liquid crystal display panel having a bump with a low dielectric coefficient (a low-k bump) upon offering a F—SiOC:H compound dielectric layer and a bump containing the F—SiOC:H compound respectively. The thin-film transistor photosensor with a low RC loading of the present invention is able to overcome the conventional problems of signal distortion and time delay of electric signals, originally contributed by an excessive RC loading in prior arts. Moreover, the liquid crystal display panel having a low-k bump can prevent black-stripe images of wide-angle display panels, resulted from a high dielectric coefficient of a bump, from happening. Additionally, the method of forming a dielectric layer having a F—SiOC:H compound utilizes specific gases to perform the thin-film deposition process so as to form a low-k F—SiOC:H dielectric layer, which only requires three steps in the entire course.

Those skilled in the art will readily observe that numerous modifications and alterations of the device and method may be made while retaining the teachings of the invention.

What is claimed is:

1. A thin-film transistor photosensor, comprising:
   a first substrate;
   a gate electrode disposed on the first substrate;
   a gate dielectric layer disposed on the first substrate and the gate electrode;
   a semiconductor layer disposed on the gate dielectric layer and corresponding to the gate electrode;
   a source electrode and a drain electrode disposed on the semiconductor layer and the gate dielectric layer and respectively disposed on two sides of the gate electrode;
   a F—SiOC:H compound dielectric layer disposed on the semiconductor layer, the source electrode, and the drain electrode; and
   a transparent protective layer disposed on the F—SiOC:H compound dielectric layer.

2. The thin-film transistor photosensor of claim 1, wherein a dielectric constant of the F—SiOC:H compound dielectric layer is substantially between 2.0 and 2.4.

3. The thin-film transistor photosensor of claim 1, further comprising an anti-reflective layer disposed between the F—SiOC:H compound dielectric layer and the transparent protective layer.

4. The thin-film transistor photosensor of claim 3, wherein the anti-reflective layer comprises a F—SiOC:H compound.

5. The thin-film transistor photosensor of claim 4, wherein a thickness of the anti-reflective layer is less than a thickness of the F—SiOC:H compound dielectric layer.

6. The thin-film transistor photosensor of claim 4, wherein an oxygen content of the anti-reflective layer is higher than an oxygen content of the F—SiOC:H compound dielectric layer.

7. A liquid crystal display panel, comprising:
   a first substrate;
   a second substrate corresponding to the first substrate;
   a bump disposed on the first substrate, wherein the bump comprises a F—SiOC:H compound; and
   a liquid crystal layer disposed between the first substrate and the second substrate.

8. The liquid crystal display panel of claim 7, wherein a dielectric constant of the F—SiOC:H compound is substantially between 2.0 and 2.4.

* * * * *